USOO5471158A

United States Patent [19]
Mehta

[11] Patent Number: 5,471,158
[45] Date of Patent: Nov. 28, 1995

[54] PRE-CHARGE TRIGGERING TO INCREASE THROUGHPUT BY INITIATING REGISTER OUTPUT AT BEGINNING OF PRE-CHARGE PHASE

[75] Inventor: Aswin N. Mehta, Houston, Tex.

[73] Assignee: Texas Instruments Incorporated, Dallas, Tex.

[21] Appl. No.: 184,409

[22] Filed: Jan. 21, 1994

Related U.S. Application Data

[63] Continuation of Ser. No. 714,190, Jun. 12, 1991, abandoned.

[51] Int. Cl.$^6$ ............................................. H03K 19/096
[52] U.S. Cl. .................. 326/95; 365/203; 327/203
[58] Field of Search .................... 365/203; 307/269, 307/481, 272.1, 272.2, 279, 452, 453; 326/95, 98; 327/202, 203, 208, 210–212

[56] References Cited

U.S. PATENT DOCUMENTS

| | | | |
|---|---|---|---|
| 4,611,133 | 9/1986 | Peterson et al. | 307/481 |
| 4,701,646 | 10/1987 | Richardson | 307/570 |
| 4,811,300 | 3/1989 | Lanfranca | 365/203 |
| 4,814,835 | 3/1989 | Tung | 357/22 |
| 4,843,254 | 6/1989 | Motegi et al. | 307/481 |
| 4,963,948 | 10/1990 | Awano | 357/16 |
| 5,021,857 | 6/1991 | Suehiro | 357/42 |

FOREIGN PATENT DOCUMENTS

| | | |
|---|---|---|
| 60-183764 | 9/1985 | Japan . |
| 60-134481 | 11/1985 | Japan . |
| 60-176277 | 1/1986 | Japan . |
| 63-46779 | 2/1988 | Japan . |
| 62-167193 | 5/1989 | Japan . |
| 1-227478 | 9/1989 | Japan . |

OTHER PUBLICATIONS

IBM Technical Disclosure Bulletin, vol. 29, No. 10, Mar. 1987, New York US pp. 4478–4479, "New Fast Page Mode Design in CMOS Dynamic RAM".

*Primary Examiner*—Edward P. Westin
*Assistant Examiner*—Andrew Sanders
*Attorney, Agent, or Firm*—Mark E. Courtney; W. James Brady; Richard L. Donaldson

[57] ABSTRACT

A pre-charge triggering technique used in connection with a synchronous pipeline stage (FIG. 1b) that includes an input register (11) that feeds a function section (12) with both non-pre-charged front-end logic (12a) and pre-charged function logic (12b). An output section (13) includes pre-charge control logic that activates a PRECHARGE line (21) to provide a PRECHARGE signal at the beginning of the pre-charge phase, i.e., at the end of the active phase. The input register is triggered (21) when the PRECHARGE line is switched active, before the next rising clock edge, so that the next active phase begins prior to the beginning of the next clock cycle, and prior to the end of the pre-charge phase of the current clock cycle (FIG. 1d). Throughput increase is obtained by initiating the next active phase at the beginning of the current pre-charge phase, passing input data to the non-pre-charged front-end logic while the pre-charged logic is still in the pre-charge phase, so that at least a portion of the pre-charge phase can be hidden in the propagation delay through the front-end.

18 Claims, 2 Drawing Sheets

PRE-CHARGE TRIGGERING TO INCREASE THROUGHPUT BY INITIATING REGISTER OUTPUT AT BEGINNING OF PRE-CHARGE PHASE

This application is a Continuation of application Ser. No. 07/714,190, filed Jun. 12, 1991 now abandoned.

TECHNICAL FIELD OF THE INVENTION

The invention relates generally to pre-charged digital devices, and more particularly relates to a pre-charge triggering apparatus and method for achieving an increase in throughput by triggering register output at the beginning of the pre-charge phase of a clock cycle (rather than the beginning of the next clock cycle). In even greater particularity, a pre-charge triggered register is responsive to a PRECHARGE signal (indicating the end of the active phase and the beginning of the pre-charge phase) to transfer the data in the master latch to the output of the register, initiating data input to the following function stage prior to the beginning of the next clock cycle.

BACKGROUND OF THE INVENTION

Microprocessors and other digital systems commonly use synchronous pipelining techniques to increase throughput. These systems are functionally divided into synchronous pipeline stages that generally include an input register followed by a function section with an output section. Each pipeline stage receives its input from an upstream pipeline stage, and after completing its task, makes its output available to a downstream pipeline stage.

Synchronous pipeline systems commonly pre-charge lines activated by n-channel transistors HI and lines activated by p-channel transistors LO, thereby taking into account the respective speeds at which these transistor-types propagate HI/LO data values. In such pre-charged systems, each clock cycle can be divided into active (or evaluation) and pre-charge phases.

The specific problem to which the invention can be applied is increasing register throughput in pre-charged synchronous pipeline systems. A more general problem is reducing the effect of the required pre-charge phase on the throughput of a given pipeline stage.

For each pipeline stage, valid data must be available at its input register for at least the minimum set up time prior to the start of a clock cycle, allowing the master section of the input register to latch the valid data and initiate an active phase. Execution time—including active phase and pre-charge phase—varies, and the system clock is adjusted to accommodate the slowest stage.

Some pipeline stages include a combination of pre-charged and non-pre-charged logic. For example, a random access memory will generally include: (a) input address/data registers, (b) a memory section that includes a decoder front-end and a memory cell array defined by wordlines and bitlines, and (c) an output section that includes sense amps and drivers. While pre-charge operations are performed in connection with the memory array (wordlines and bitlines) and the sense amp, implementing pre-charge for the decoder front-end is generally impractical.

In normal operation of the memory stage, a valid address/data from an upstream stage may be available at the input address/data registers significantly prior to the beginning of a new clock cycle, i.e., while the memory stage is still in the pre-charge phase of the current clock cycle. This address/data is held at the input registers until the beginning of the new clock cycle, and the completion of the pre-charge phase, at which time it is latched by the master latch in the input register, and propagates through the slave latch to the decoder front-end, and thence to the pre-charged memory array. In other words, the memory stage awaits the completion of the pre-charge phase even though the valid address/data is available at the input registers.

Accordingly, a need exists for increasing throughput through pre-charged digital systems in general, and in particular, for reducing the effect of pre-charge on throughput.

SUMMARY OF THE INVENTION

The invention is a pre-charge triggering technique that achieves an increase in throughput by triggering register output at the beginning of the pre-charge phase of a clock cycle, i.e. prior to the beginning of the next clock cycle. In an exemplary embodiment, pre-charge triggering is used in a synchronous pipeline stage to transfer data in the input register to non-pre-charged front-end logic to initiate a new active phase prior to the end of the pre-charge phase for the pre-charged logic.

In one aspect of the invention, the pre-charge triggering technique is used with a clocked device included in a pre-charged digital system in which a PRECHARGE signal indicates the end of an active phase and the beginning of a pre-charge phase—the clocked device would normally be triggered at the beginning of each clock cycle to initiate an active phase. The pre-charge triggering technique involves: (a) presenting input data to a clocked device in preparation for the beginning of the next active phase, and (b) prior to the beginning of the next clock cycle, triggering the clocked device using a PRECHARGE signal (thereby beginning the next active phase prior to the end of the current pre-charge phase).

In another aspect of the invention, the pre-charge triggering technique is used with a functional stage that includes a clocked input register followed by non-pre-charged front-end logic and pre-charged function logic, and that generates a PRECHARGE signal indicating the end of an active phase and the beginning of a pre-charge phase. When the input register is triggered (such as at the beginning of a clock cycle), it initiates an active phase by providing input data to the front-end logic.

For this aspect of the invention, the pre-charge triggering technique involves: (a) presenting input data to the input register in preparation for the next active phase; (b) prior to the beginning of the next clock cycle, triggering the input register using the PRECHARGE signal; and (c) in response to pre-charge triggering, transferring the input data from the input register to the front-end logic to initiate a new active phase prior to end of the pre-charge phase for the pre-charged logic.

This pre-charge triggering technique provides an additional design parameter for improving throughput of a functional stage. That is, throughput improvements may be achieved even for functional stages in which all logic sections can be pre-charged by designing the function section to include non-pre-charged front-end logic such that the pre-charge time for the remaining pre-charge is hidden in the propagation delay through the non-pre-charged front end.

In an exemplary embodiment of the invention, the pre-charge triggering technique is used with a synchronous pipeline memory stage that includes input address/data registers, non-pre-charged front-end decoder logic, a pre-charged memory array, and pre-charged output logic. Each input address/data register is a conventional master/slave register to which is added a pre-charge pass gate in parallel with the slave latch pass gate—when turned on by the PRECHARGE signals, the pre-charge pass gate passes data latched in the master latch through the slave latch to the register output.

An upstream pipeline stage presents valid address/data to the input address/data registers prior to the end of the current active phase for the memory stage. The input address/data registers are responsive to the PRECHARGE signal to transfer the valid address/data to the front-end decoder logic, thereby beginning the next active phase prior to the end of the current pre-charge phase.

The technical advantages of the invention include the following. The pre-charge triggering technique permits a new active phase to begin prior to the end of the current pre-charge phase by triggering the start of an active phase using a PRECHARGE signal. In the case of an input register, the PRECHARGE signal causes data latched in the master latch to be passed through the slave latch to the register output prior to the slave pass gate being triggered at the beginning of the next clock cycle. In the case of a functional stage, such as a synchronous pipeline stage, the PRECHARGE signal can be used to cause valid data at the input register to be passed directly to non-pre-charged front-end logic, initiating a new active phase prior to completing pre-charge of the pre-charged logic, thereby permitting at least a portion of the pre-charge phase to be hidden in the propagation delay through the non-pre-charged front-end logic. Thus, pre-charge triggering provides design flexibility in achieving optimum throughput for functional stages through the inclusion of non-pre-charged front-end logic. Even if a functional stage is entirely pre-charged (i.e., it does not include any non-pre-charged front end logic), a minimum throughput improvement corresponding to the propagation delay through the slave pass gate and latch of the input register can be achieved by pre-charge triggering the input register so that data transfer to the following function section begins immediately at the beginning of the next clock cycle (i.e., at the beginning of the next active phase).

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which.

DETAILED DESCRIPTION OF THE INVENTION

The Detailed Description of an exemplary embodiment of the pre-charge triggering technique is organized as follows:

1. Pre-Charge Triggering Technique
2. Exemplary Implementations
   2.1. Pre-Charge Triggered Register
   2.2. Pre-Charge Triggered Memory Stage
3. Conclusion The exemplary pre-charge triggering technique is used in connection with a synchronous pipeline system in which a given pipeline stage, such as a memory stage, includes non-pre-charged front-end logic, which allows pre-charge triggering to initiate a new active phase while the remaining pre-charged logic is still in the pre-charge phase. However, the invention has general applicability for use in pre-charged digital devices and systems.

1. Pre-Charge Triggering.

The exemplary pre-charge triggering technique used in connection with a pipeline stage in a synchronous pipeline system that includes an input register that feeds a function section with both non-pre-charged front-end logic and pre-charged function logic.

Figure 1A:
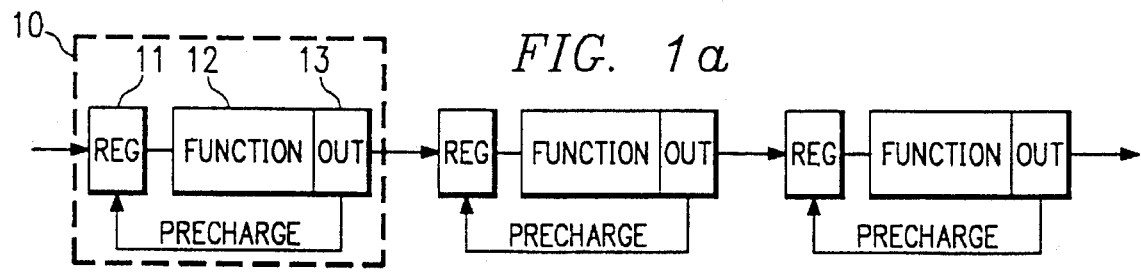
FIG. 1a schematically illustrates a synchronous pipeline system in which various pipeline stages use pre-charge triggering.

FIG. 1a illustrates a portion of a synchronous pipeline system with pipeline stages 10. Each pipeline stage 10 includes an input register 11, followed by a function section 12 and an output section 13.

For each pipeline stage, the output section includes pre-charge control logic that activates a PRECHARGE line to provide a PRECHARGE signal at the beginning of the pre-charge phase, i.e., at the end of the active phase. Some pipeline stages in a pipeline system may not use pre-charging, and therefore, would not include any pre-charge control logic.

Figure 1B:
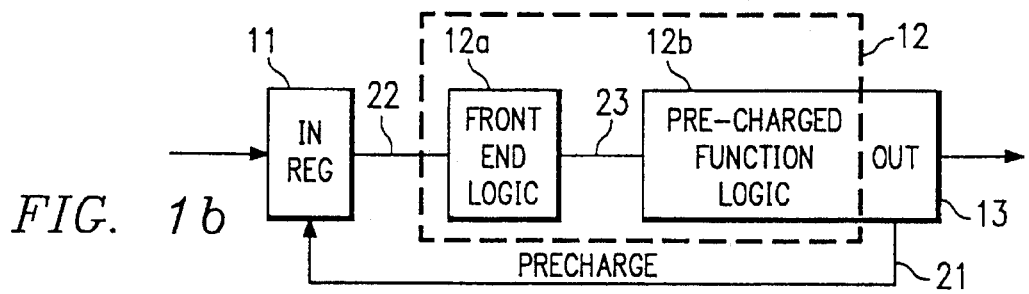
FIG. 1b illustrates the pre-charge triggering technique for a given pipeline stage.

FIG. 1b illustrates in more detail one of the pipeline stages. The function section 12 includes non-pre charged front-end logic 12a and pre-charged logic 12b. The output section, which may be pre-charged, includes the pre-charge control logic necessary to control the PRECHARGE line.

The pre-charge triggering technique requires that the upstream stage complete its active phase so that valid data is available at the input register when it is triggered. The input register is triggered (21) when the PRECHARGE line is switched active, before the next rising clock edge, so that the next active phase begins prior to the beginning of the next clock cycle (and prior to the end of the pre-charge phase of the current clock cycle). Input data present at the input register is then transferred (22) to the front-end logic 12a. Because the front-end logic does not have to wait for the pre-charge phase to complete, it immediately begins processing the input data.

After a front-end propagation delay, the output of the front-end logic 12a is available for the pre-charged logic 12b—front-end logic output is disabled until the pre-charge control logic indicates that the pre-charge phase is complete. At the beginning of the next clock cycle, the pre-charge control logic switches the PRECHARGE line inactive, indicating the end of the pre-charge phase, and the output of the front-end logic is passed (23) to the pre-charged logic. When the pre-charged logic has completed its processing and valid output data is available from the output logic section 13, the pre-charge control logic in the output logic section switches the PRECHARGE line (21) active, initiating both the next pre-charge phase and the next active phase.

That is, the PRECHARGE signal (a) switches active, initiating the next active phase, when the current active phase is complete and valid data is available from the output logic section 13, and (b) switches inactive, indicating the end of the pre-charge phase, in synchronism with the rising edge of the system clock. Throughput increase is obtained by initiating the next active phase at the beginning of the current pre-charge phase, passing input data to the non-pre-charged front-end logic while the pre-charged logic is still in the pre-charge phase, so that at least a portion of the pre-charge phase can be hidden in the propagation delay through the front-end. The amount of the pre-charge delay that can be hidden depends upon the relative duration of the front-end propagation delay and the pre-charge phase.

Figure 1C:
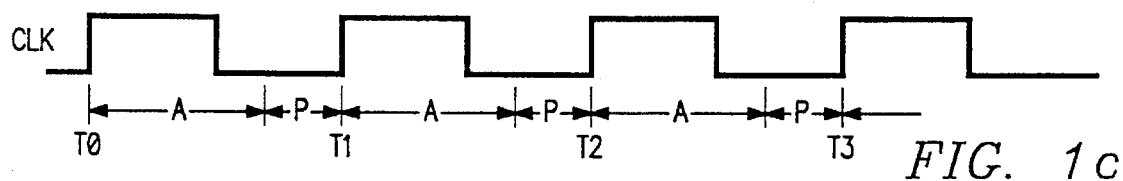
FIGS. 1c and 1d illustrate waveforms comparing clock cycle and active/pre-charge cycle respectively for a pipeline stage that does not use pre-charge triggering, and a pipeline stage that does.
Figure 1D:
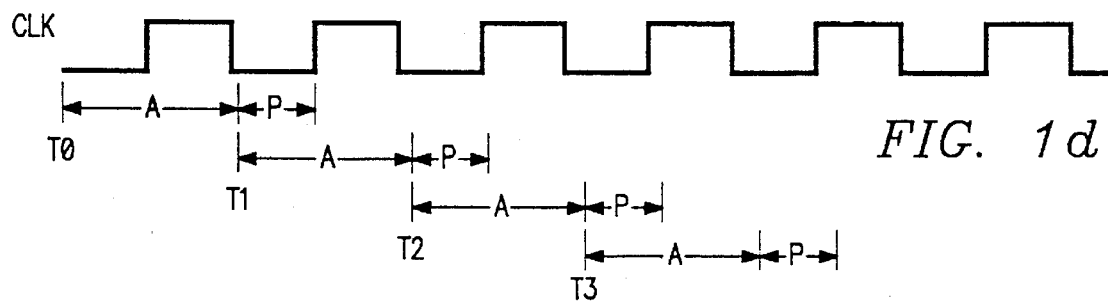

FIGS. 1c and 1d illustrate the difference between a pipeline stage that do not use pre-charge triggering, and pipeline stages that do. The increase in throughput obtained by pre-charge triggering will be seen to be the duration of the pre-charge phase (assuming that the entire pre-charge phase can be hidden in the propagation delay through non-pre-charged front-end logic).

Referring to FIG. 1c, for a pipeline stage that does not use pre-charge triggering, the period of the clock cycle coincides with the period of the active/pre-charge cycle. Thus, at time T0, a new clock cycle (rising clock edge) begins a new active phase. At some time during the clock cycle, the active phase ends and the pre-charge phase begins. At the end of the clock cycle, the pre-charge phase ends, and a new active phase begins at T1 (with the beginning of the next clock cycle).

Referring to FIG. 1d, for a pipeline stage that uses pre-charge triggering, the beginning of each clock cycle corresponds to the end of the pre-charge phase, while the beginning of an active phase corresponds to the beginning of the pre-charge phase., Thus, an active phase begins at time T0 and ends at time T1, corresponding to the beginning of the pre-charge phase—at the same time, T1, the next active phase begins (i.e., during the current pre-charge phase). At the beginning of the next clock cycle, the current pre-charge phase ends. Similarly, subsequent active phases are initiated at times T2 and T3 corresponding to the beginning of the associated pre-charge phase.

The overlap between the current pre-charge phase and the next active phase (which began at the beginning of the current pre-charge phase) is assumed to be hidden in non-pre-charged front-end logic—at the end of a pre-charge phase, the output of the non-pre-charged front-end logic is input to the pre-charged logic to complete the active phase. Thus, this overlap, i.e., the duration of the pre-charge phase, represents the increase in throughput obtainable by using the pre-charge triggering technique (again, assuming that the entire pre-charge phase can be hidden the propagation delay through the non-pre-charged front-end logic).

For example, for a nominal 25 ns cycle time (without pre-charge triggering) and an assumed active/pre-charge ratio of 4/1, a new active/pre-charge cycle will begin about 20 ns after the initiation of the active phase. Thus, pre-charge triggering would allow an active/pre-charge cycle time of 20 ns.

As a matter of system design, without pre-charge triggering, the system cycle time will generally be determined by the longest active phase and the longest pre-charge phase (which typically, but not necessarily, occur in the same stage). By adding pre-charge triggering, certain portions of the pre-charge phases for at least some of the pipeline stages can be hidden in the initial part of the active phase, i.e., the propagation delay through the non-pre-charged front end logic. The throughput gains available from pre-charge triggering are thus factored in to derive a final system clock cycle time, and the PRECHARGE signal is synchronized to that clock.

2. Exemplary Implementations.

Figure 2:
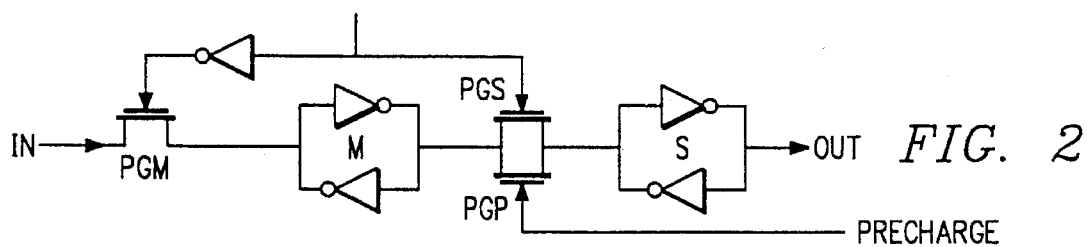
FIG. 2 functionally illustrates an exemplary pre-charge triggered register, such as would form an input register for a pipeline stage.
Figure 3A:
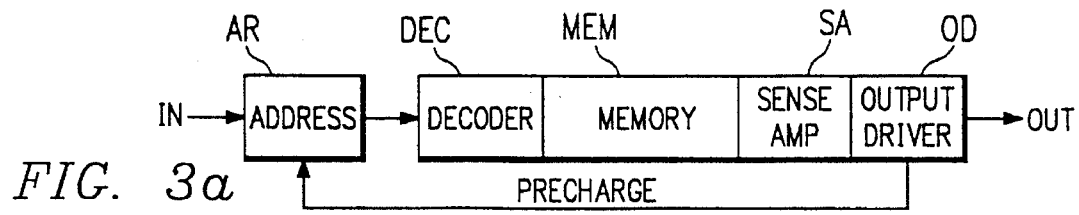
FIG. 3a functionally illustrates an exemplary pre-charge triggered memory stage in a synchronous pipelined system.

FIG. 2 and 3a illustrate exemplary implementations of the pre-charge triggering technique described in Section 1: FIG. 2 illustrates a pre-charge triggered register; FIG. 3a illustrates a pre-charge triggered memory stage of a synchronous pipelined system.

2.1. Pre-Charge Triggered Register.

Referring to FIG. 2a, the exemplary pre-charge triggered register is implemented from a conventional master/slave register modified to provide pre-charge triggering. The normal register configuration comprises a master pass gate PGM and a master latch LM, followed by a slave pass gate PGS and a slave latch LS.

The clock is applied directly to the slave pass gate and through an invertor to the master pass gate. A rising clock edge closes the master pass gate PGM, latching the input data into the master latch, and opens the slave pass gate, passing the latched data on to the register output (with a propagation delay of one pass gate and one invertor).

Pre-charge triggering is implemented by incorporating a pre-charge pass gate PGP in parallel with the slave pass gate PGS. Now, the register output can be triggered by a PRECHARGE signal opening the pre-charge pass gate PGP, passing data in the master latch through the slave latch to the register output even in the absence of a rising clock edge at PGM and PGS. For pre-charge triggering, valid data must be in the master latch prior to the receipt of the PRECHARGE signal, and must remain valid at least until the next rising clock edge closes the master pass gate to isolate the register output from logic level changes on the register input.

2.2. Pre-Charge Triggered Memory Stage.

Referring to FIG. 3a, the exemplary pre-charge triggered memory stage of a pipeline system is implemented using a conventional memory stage, which is modified to include a pre-charge triggered input address/data register ADR configured for pre-charge triggering as described in Section 2.1.

The pre-charged memory includes an input address register AR that passes addresses from the input to the following memory section, which includes non-pre-charged front-end decoder logic DEC, a memory array MEM, sense amp logic SA, and output driver logic OD. The output driver logic includes pre-charge control logic that controls a PRECHARGE line coupled to the address register AR.

Figure 3B:
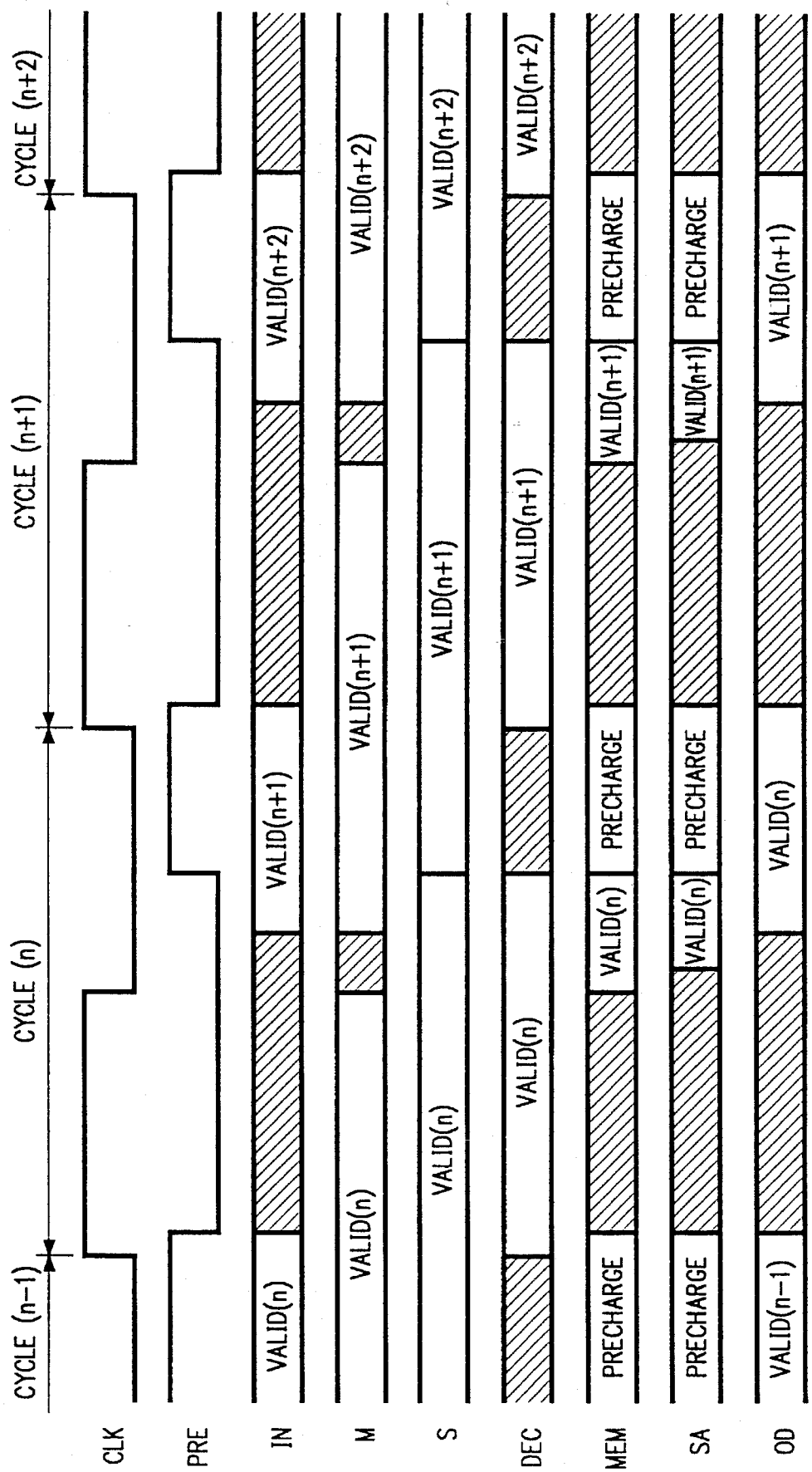
FIG. 3b illustrates timing diagrams for the pre-charge triggering technique in connection with the memory stage.

FIG. 3b provides waveforms for the various logic sections that illustrate the operation of the pre-charge triggered memory stage, including pre-charge triggering. The system clock CLK and the PRECHARGE waveform (indicating active and pre-charge phases) are also shown.

A valid input address (from an upstream stage) is assumed to be available at the input address register AR (waveform IN) for a time longer than the set up time for the master latch (waveform M), and at a time prior to the PRECHARGE line being driven HI to indicate the start of the pre-charge phase (and the end of the active phase). This input address is held in the input address register because the slave pass gate is closed (waveform S).

Prior to the beginning of the next clock cycle, a PRECHARGE signal triggers the input address register AR (i.e., opens the pre-charge pass gate), and the input address is passed to the front-end decoder logic (waveform DEC), beginning the next active phase. At this time, the memory array MEM, the sense amp SA and output driver OD are still in the current pre-charge phase (waveforms MEM, SA, and OD).

When decoder execution is completed, the decoded address is ready for input to the memory array MEM. If the propagation delay for the front-end decoder logic is less than the pre-charge delay, then the decoded address is held at the output of the decoder logic until the end of the pre-charge phase (i.e., the PRECHARGE signal is also used to enable decoder output to the memory array).

At the beginning of the next clock cycle, the pre-charge control logic pulls the PRECHARGE line LO, signalling the end of the current pre-charge phase. Since the next active phase began with the PRECHARGE signal (PRECHARGE line HI), the decoded address is already available to be applied to the memory array (assuming that the propagation delay through the decoder logic is no longer than the pre-charge phase). The input address activates the appropriate wordlines and bitlines to retrieve the addressed data, which is sensed by the sense amp logic SA and output by the output driver logic OD (waveforms MEM, SA, and OD).

When valid addressed data is output from the output driver logic OD, the pre-charge control logic drives the PRECHARGE line HI, indicating the end of the active phase, and the beginning of the next pre-charge phase for the memory array, sense amp logic, and output driver logic. This operation, in turn, begins the next active phase by passing the next input address from the input address register to the front-end decoder logic.

Thus, the pre-charge triggering technique provides an additional design parameter for increasing throughput of a pre-charged pipeline system. For pre-charged pipeline stages with non-pre-charged front-end logic, initiating the next active phase at the beginning of the current pre-charge phase enables at least a portion of the pre-charge delay to be hidden in the front-end propagation delay. Even for pipeline stages that ordinarily pre-charge all constituent logic sections, designing the stage to include a non-pre-charged front-end may yield a throughput dividend that offsets any penalty from not pre-charging the front-end.

For those pipeline stages that do not include any non-pre-charged front end, a throughput increase of at least one slave pass gate plus one slave invertor is obtainable by pre-charge triggering the input register so that input data is already available at the register output at the end of the pre-charge phase (i.e., at the beginning of the clock cycle).

3. Conclusion.

Although the Detailed Description of the invention has been directed to certain exemplary embodiments, various modifications of these exemplary embodiments, as well as alternative embodiments, will be suggested to those skilled in the art. For example, other pre-charged systems that could take advantage of the pre-charge triggering technique include programmable logic arrays (because of long bitlines in the AND- and OR-planes) and read only memories.

It is to be understood that the invention encompass any modifications or alternative embodiments that fall within the scope of the appended claims.

What is claimed is:

1. A pre-charge triggering method for use in a precharged digital device that includes input logic that is triggerable during each clock cycle to initiate an active phase, and the digital device generating a PRECHARGE signal to indicate the end of one active phase and the beginning of a pre-charge phase and the beginning of the next active phase, comprising the steps:

presenting input data to the input logic in preparation for the beginning of the next clock cycle; and prior to the beginning of each clock cycle, triggering the input logic using the PRECHARGE signal to pass the input data to the output of the input logic.

2. The pre-charge triggering method of claim 1, wherein the digital device further includes function logic, and further comprising, after the step of triggering the input logic, the steps:

passing input data from the input logic to the function logic; and processing input data in the function logic during the active phase and then generating the PRECHARGE signal.

3. The pre-charge triggering method of claim 1, wherein the digital device further includes pre-charged function logic, and further comprising, after the step of triggering the input logic, the steps:

disabling the input of the input data to the pre-charged function logic until the end of the pre-charge phase; and processing input data in the pre-charged function logic during the active phase and then generating the PRECHARGE signal indicating the beginning of a new pre-charge phase;

such that throughput is increased by the overlap of portions of the pre-charge phase with the delay through the input logic.

4. A pre-charge triggered digital device that is characterized by an active phase and a pre-charge phase, with the end of the active phase and the beginning of the pre-charge phase being indicated by a PRECHARGE signal, comprising:

input logic that receives and stores input data prior to being triggered; and function logic that processes input data received from said input logic during the active phase, at least a portion of such function logic being pre-charged;

said input logic being triggered by said PRECHARGE signal to make the input data available to said function logic, said pre-charge phase ending at the beginning of the next clock cycle;

wherein said pre-charged portions of said function logic are disabled from receiving input data from said input logic until the end of the precharge phase, and wherein said input logic is triggered by said PRECHARGE signal to make the stored input data available to said function logic, such that throughput is increased by the overlap of portions of the pre-charge phase with the delay through the input logic.

5. A pre-charge triggered digital device that is characterized by an active phase and a pre-charge phase, with the end of the active phase and the beginning of the pre-charge phase being indicated by a PRECHARGE signal, comprising:

input logic that receives and stores input data prior to being triggered; and function logic that processes input data received from said input logic during the active phase, at least a portion of such function logic being pre-charged;

said input logic being triggered by said PRECHARGE signal to make the input data available to said function logic, said pre-charge phase ending at the beginning of the next clock cycle; wherein said function logic includes pre-charge control logic for generating the PRECHARGE signal.

6. A pre-charge triggered digital device that is characterized by an active phase and a pre-charge phase, with the end Of the active phase and the beginning of the pre-charge phase being indicated by a PRECHARGE signal, comprising:

input logic that receives and stores input data prior to being triggered; and function logic that processes input data received from said input logic during the active phase, at least a portion of such function logic being pre-charged;

said input logic being triggered by said PRECHARGE signal to make the input data available to said function logic, said pre-charge phase ending at the beginning of the next clock cycle;

wherein the input logic comprises an input register that passes data from a master latch through a slave latch to the register output when triggered either at the beginning of the next clock cycle or by the PRECHARGE signal.

7. The pre-charge triggered digital device of claim 6, wherein said input register includes:

a slave pass gate responsive to a clock signal for passing input data from said master latch through said slave latch to the register output; and a pre-charge pass gate responsive to the PRECHARGE signal for passing input data from said master latch through said slave latch to the register output independent of said slave pass gate.

8. A pre-charge triggering method for a pre-charged functional stage in which a PRECHARGE signal indicates the end of an active phase and the beginning of a pre-charge phase, and in which the functional stage includes input logic followed by non-pre-charged front-end logic and pre-charged function logic, with the input logic being triggerable during each clock cycle to make input data available to the front-end logic, comprising the steps:

presenting input data to the input logic in preparation for the beginning of the next clock cycle;

prior to the beginning of the next clock cycle, triggering the input logic using the PRECHARGE signal; and then passing the input data from the input logic to the front-end logic to initiate a new active phase prior to end of the pre-charge phase for the pre-charged logic;

thereby hiding at least a portion of the pre-charge phase in the propagation delay through the front-end logic.

9. The pre-charge triggering method of claim 8, wherein the propagation delay through the front-end logic is less than the pre-charge phase, further comprising the step of disenabling output from the front-end logic until the end of the pre-charge phase.

10. The pre-charge triggering method of claim 8, wherein the pre-charged function logic includes pre-charge control logic, and further comprising the step of generating the PRECHARGE signal using the pre-charge function logic.

11. A pre-charge triggered functional stage in which a PRECHARGE signal indicates the end of an active phase and the beginning of a pre-charge phase, comprising:

input logic that receives and stores input data prior to being triggered;

non-pre-charged front-end logic that processes input data from said input logic at the beginning of an active phase;

pre-charged function logic that processes data received from said front-end logic during the active phase;

said input logic being triggered by said PRECHARGE signal to transfer the input data to said non-pre-charged front-end logic;

thereby hiding at least a portion of the pre-charge phase in the propagation delay through the front-end logic.

12. The pre-charge triggered functional stage of claim 11, wherein the propagation delay through said front-end logic is less than the pre-charge phase, and wherein the output from said front-end logic is disabled until the end of the pre-charge phase.

13. The pre-charge triggered functional stage of claim 11, wherein said pre-charged function logic includes pre-charge control logic for generating the PRECHARGE signal.

14. The precharge triggered functional stage of claim 11, wherein said input logic comprises an input register that passes data from a master latch through a slave latch to the register output when triggered either at the beginning of the next clock cycle or by the PRECHARGE signal.

15. The pre-charge triggered functional stage of claim 14, wherein said input register includes:

a slave pass gate responsive to a clock signal for passing input data from said master latch through said slave latch to the register output; and a pre-charge pass gate responsive to the PRECHARGE signal for passing input data from said master latch through said slave latch to the register output independent of said slave pass gate.

16. The pre-charge triggered functional stage of claim 11, wherein the functional stage is a memory stage that includes input address/data registers, non-pre-charged front-end decoder logic, a pre-charged memory array, and pre-charged output logic with pre-charge control logic.

17. A synchronous pipeline system including multiple pre-charged pipeline stages in which a PRECHARGE signal indicates the end of an active phase and the beginning of a pre-charge phase, with each pre-charged pipeline stage comprising:

input logic that receives and stores input data prior to being triggered;

function logic, at least a portion of which is precharged, that processes data received from said input logic at the beginning of an active phase;

said input logic being triggered by said PRECHARGE signal to make input data available to said function logic;

wherein, for at least one of said precharged pipeline stages, said function logic comprises:

non-pre-charged front-end logic that processes input data from said input logic at the beginning of an active phase; and pre-charged function logic that processes data received from said front-end logic during the active phase;

said input logic being triggered by said PRECHARGE signal to transfer the input data to said non-pre-charged front-end logic;

thereby hiding at least a portion of the pre-charge phase in the propagation delay through the front-end logic.

18. The synchronous pipeline system of claim 17, wherein the propagation delay through said front-end logic is less than the pre-charge phase, and wherein the output from said front-end logic is disabled until the end of the pre-charge phase.

* * * * *